United States Patent
Tsuchida et al.

(10) Patent No.: US 7,417,827 B2
(45) Date of Patent: Aug. 26, 2008

(54) HEAD/SLIDER SUPPORTING STRUCTURE HAVING LEAD WIRE INCLINED RELATIVE TO SLIDER PAD

(75) Inventors: Hiroyasu Tsuchida, Kanagawa (JP); Tatsumi Tsuchiya, Kanagawa (JP); Takaaki Murokawa, Kanagawa (JP); Yuhsuke Matsumoto, Kanagawa (JP); Yoshio Uematsu, Kanagawa (JP); Tatsuya Tanaka, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 352 days.

(21) Appl. No.: 11/071,394

(22) Filed: Mar. 2, 2005

(65) Prior Publication Data
US 2005/0195529 A1    Sep. 8, 2005

(30) Foreign Application Priority Data
Mar. 2, 2004    (JP)    ............................. 2004-058021

(51) Int. Cl.
*G11B 5/60* (2006.01)

(52) U.S. Cl. .................................................. 360/234.5

(58) Field of Classification Search ............... 360/234.5
See application file for complete search history.

(56) References Cited

U.S. PATENT DOCUMENTS

| | | | |
|---|---|---|---|
| 5,757,585 A * | 5/1998 | Aoyagi et al. | 360/234.5 |
| 5,889,636 A | 3/1999 | Arya et al. | |
| 5,896,247 A | 4/1999 | Pan et al. | |
| 6,188,546 B1 * | 2/2001 | Nakajima et al. | 360/234.5 |

FOREIGN PATENT DOCUMENTS

| | | |
|---|---|---|
| JP | 11-096710 | 4/1999 |
| JP | 2002-251705 | 9/2002 |
| JP | 2003-123217 | 4/2003 |

* cited by examiner

*Primary Examiner*—A. J. Heinz
(74) *Attorney, Agent, or Firm*—Townsend and Townsend and Crew LLP; Darren Gold

(57) ABSTRACT

Embodiments of the invention provide a head/slider supporting structure which has connection properties excellent in solder ball connections of a slider pad and a lead pad. According to one embodiment, in a head/slider supporting structure for connecting a slider and a lead wire by re-flowing a solder ball, a connection distance between a slider pad and an extreme end portion of the lead wire is reduced to enhance the performance of solder connection. The lead wire is inclined forwardly of the slider pad.

5 Claims, 9 Drawing Sheets

(A)

(B)

(A)

(B)

HEAD/SLIDER SUPPORTING STRUCTURE HAVING LEAD WIRE INCLINED RELATIVE TO SLIDER PAD

CROSS-REFERENCES TO RELATED APPLICATIONS

This application claims priority from Japanese Patent Application No. JP2004-058021, filed Mar. 2, 2004, the entire disclosure of which is incorporated herein by reference.

BACKGROUND OF THE INVENTION

The present invention relates to the technique for solder-connecting a head provided on a slider of a magnetic disk drive, a magneto-optical disk drive or the like and a lead wire connected to a circuit base plate, and more specifically, to the technique for enhancing the positive properties of connection between a slider pad and a lead wire using a solder ball.

In the magnetic disk drive, a head for converting a magnetic signal to an electric signal carries out writing or reading of data with respect to the magnetic disk. A head and a slider constitute a head/slider, and a supporting structure called a suspension assembly supports the head/slider. The head/slider flies, in reading or writing data, above the magnetic disk which rotates at high speed while performing track following operation called pitch and roll movement or gimbals movement.

A semiconductor chip for carrying out control and data transfer of the magnetic disk drive is mounted on the circuit base plate, and it is necessary to electrically connect the head and the circuit base plate of the magnetic disk drive by means of a lead wire. Recently, as recording density enhances, demand of the head with respect to the control characteristics becomes severe, influence of weight, arrangement and the like of the lead wire on positional control of the head cannot be ignored. As a result, there is a tendency that a wiring integrated type flexure assembly is employed in which a wiring is adhered to or a wiring pattern is formed on the flexure to reduce unbalance given by the wiring to the gimbals characteristics of flexure. In the wiring integral type flexure assembly, the sliding pad connected to the head need be connected electrically to the end of the lead wire. As one connecting method, there is a supersonic adhesion method as shown in Japanese Patent Laid-Open No. Hei 11-96710. In this method, the end of the lead wire is placed on the slider pad to provide connection while giving vibrations to a gold ball by means of a bonding tool. Recently, the magnetic disk drive is further miniaturized, the slider is also miniaturized, and the gimbals movement is made finer, because of which it becomes necessary to reduce the stress as much as possible on the slider or the lead wire when the lead wire is connected. Further, in the supersonic adhesion method, there is a fear that static electricity generated in the course of adhesion is discharged to break the slider or the head, and there is pointed out limitation as the adhesion method for further miniaturized head/slider.

As another method for connecting the head/slider and the lead wire, there exists a solder ball adhesion method capable of connecting with respect to a connection portion in non-contact. Japanese Patent Laid-Open No. 2002-251705 discloses the technique regarding the slider ball adhesion method. FIGS. 4 and 5 of that patent reference show a method in which the bonding pad and lead pad provided on the slider are arranged at right angles, the spherical solder ball is temporarily fixed so as to come in contact with both the pads, and afterward, the solder allows re-flow by a laser beam to provide solder connection. Further, Patent Japanese Patent Laid-Open No. 2003-123217 likewise relates to the solder ball connection, and FIGS. 4 and 5 and the description of that patent reference clearly describes that an angle between the head pad and the lead pad is 90 degrees.

In U.S. Pat. No. 5,896,247, the prior art with respect to the invention of Patent Document 4 is described referring to FIG. 5 thereof. In the description of FIG. 5 in that patent document, there is described that prior to mounting the slider, the flexure tang mounting the slider and the support layer are at the same level. Further, there is described that it is necessary to extend the dielectric layer toward the slider from the copper trace in order to eliminate possible short-circuiting trouble, and as a result, the slider is mounted on the flexure tang, and during the copper trace and the transducer pad are connected by solder ball or gold ball, the dielectric layer has to be pressed down by the thickness of the dielectric layer under the slider.

BRIEF SUMMARY OF THE INVENTION

FIG. 1 is a view explaining the state that the lead pad and the slider pad are subjected to solder ball connection. FIG. 1(A) shows metallic layers 19a, 19b constituting a supporting structure of flexure, dielectric layers 17a, 17b laminated on the metallic layers 19a, 19b, and a copper layer 21 laminated on the dielectric layer 17b so as to constitute a lead wire. A slider 11 is mounted on the dielectric layer 17a, and a slider pad 13 connected to a head not shown is provided on the slider 11. The metallic layer 19a supporting the slider 11 conducts gimbals movement with a dimple formed on a load beam (not shown) called a flexure tang, as a supporting point.

On the front surface of the slider pad 13, a lead wire 21 extends to a position leaving a space 25 with respect to the slider 11, and a lead pad 29 is formed at the extreme end portion of the lead wire 21. When a spherical solder ball 15 is temporarily fixed so as to come in contact with the slider pad 13 and the lead pad 29, and a laser beam is irradiated from the direction indicated by arrow A, the solder ball 15 becomes fused. After that, when the irradiation of the laser beam is stopped to let leaving and cooling, a solder fillet 27 shown in FIG. 1(B) is formed whereby both the pads can be electrically connected. In the solder ball connection, when the solder ball 15 is allowed to re-flow, inferior connections sometimes occur such that the fused solder is strongly attracted by one of the pads so that the solder fillet 27 is not connected to the other pad; a contact area between the solder fillet 27 and the pad is short; the connection strength is short; or short-circuiting with the adjacent pad.

During the course of studying the measures for the inferior connections, we found that an effective method for carrying out the adequate solder ball connection is, in addition to an improvement of solder wetting properties of the pad or improvement of material of solder, to shorten a connection distance 23 between the slider pad 13 and the lead pad 29. The connection distance 23 is a shortest distance between the extreme end portion of the lead pad 29 and the end of the slider pad 13. To shorten the connection distance 23, there is a method for moving the lead wire 21 closer to the slider 11 to thereby narrow the space 25 and shorten the horizontal distance, which however has a limit in terms of securing a positional tolerance when the slider 11 is fixed to the dielectric layer 17a.

Next, where the vertical distance between both the pads is intended to be shortened, the flexure has been heretofore designed so that the surface including the slider pad 13 and the surface including the lead pad 29 cross at right angles, because of which it is necessary to change it, as shown in Japanese Patent Laid-Open No. 2002-251705 or Japanese Patent Laid-Open No. 2003-123217 also. The reason why they are crossed at right angles seems to lie in that generally, in the wiring integral flexure structure employing the solder ball connection, the metallic layer 19b supporting the lead pad 29 and the metallic layer 19a supporting the slider 11 are formed to be the same plane using the same material in the same process, and the plane structure has been maintained except for special reasons.

Further, the above reason seems to lie in that since the flexure is the structure for carrying out the fine gimbals movement, a displacing portion or a bending portion is provided on the metallic layers 19a, 19b so as to avoid changing the operating characteristics. Further, the above reason seems to lie in that as shown in Japanese Patent Laid-Open No. 2002-251705, in the solder connection, the slider pad and the lead pad are set to a connection device so as to each open at 45 degrees with respect to the vertical direction, allowing the supplying work or fixing work of the solder ball to be smoothly conducted, and making it convenient. Therefore, the connection distance between the surface including the slider pad 13 and the surface including the lead pad 29 has been determined so far as in the structure shown in FIG. 1.

In U.S. Pat. No. 5,896,247, FIG. 5 shows the state that a support layer is inclined toward a transducer pad. However, since the amount of inclination is, say, about the thickness of the dielectric layer, it is said that substantially, the extending surface of the transducer pad and the extending surface of the copper trace cross at right angles. Therefore, the connection distance 23 is determined according to the distance B between the bottom of the slider pad 13 provided on the side of the slider 11 and the bottom of the slider 11, and the width of the space 25 provided between the lead wire 21 and the slider 11. As described above, there is a limit in narrowing the space 25, and the distance B also need to have a predetermined length in order to prevent short-circuiting between the metallic layer 19a and the slider pad 13 due to the solder ball connection.

It is therefore a feature of the present invention to provide a head/slider supporting structure provided, in a solder ball connection of a slider pad and a lead pad, with an excellent connection performance. A further feature of the present invention is to provide a rotating disk storage device having head/slider supporting structure with excellent connection performance.

In a head/slider supporting structure for solder ball connecting a slider and a lead wire, according to a feature of the invention, a connection distance between an end of a slider pad and an extreme end portion of a lead wire is shortened to thereby enhance the performance of solder connection.

According to a first aspect of the present invention, a head/slider supporting structure comprises a slider supporting portion; a head/slider having a bottom secured to said slider supporting portion, and including a head and a slider pad connected to said head; and a lead wire capable of being solder ball connection to said slider pad; wherein a plane including an extreme end portion of said lead wire and a plane including said slider pad cross each other at a crossing angle less than 90 degrees on a surface on which said solder ball is arranged.

Since the plane including an extreme end portion of the lead wire and the plane including the slider pad cross each other at a crossing angle less than 90 degrees on a surface on which the solder ball is arranged, the connection distance therebetween can be reduced so that both the planes can securely be connected to each other when the solder ball is allowed to re-flow. When the crossing angle is made to be about 70 to 80 degrees, a relation between the size of the solder ball and the connection distance becomes appropriate. The extreme end portion of the lead wire is a part that is electrically connected to the slider pad, and a pad for fixing a solder ball may be suitably formed.

When the solder ball connection is applied to a wiring integral flexure assembly employed as the head/slider supporting structure adapted to high-density recording, it will be effective because no electrostatic breakdown occurs in the head or no extra stress is applied to the structure. The wiring integral flexure assembly includes a lamination structure of a metallic layer, a conductor layer forming a lead wire, and a dielectric layer insulating the metallic layer from the conductor layer. In addition, the extreme end portion of the lead wire can be separated from the dielectric layer to form a bending crossing angle. Further, the extreme end portion of the lead wire can be made integral with the dielectric layer, which is separated from the metallic layer and bended to form a crossing angle. Alternatively, the metallic layer, the dielectric layer and the conductor layer can be made to be integral and inclined to form a crossing angle. Further, alternatively, one of or both the metallic layer and the dielectric layer located under the extreme end portion of the lead wire may be laminated thicker than other portions so that the extreme end portion of the lead wire may be inclined.

The dielectric layer laminated on the platform of the metallic layer provided forwardly of the slider pad extends toward the slider pad beyond the end of the platform whereby it is possible to prevent the conductor layer from short-circuiting with the metallic layer in the solder ball connection. Further, the conductor layer extends toward the slider pad beyond the end of the dielectric layer whereby the dielectric layer can be prevented from burning when a laser beam is irradiated.

According to a second aspect of the present invention, a head/slider supporting structure comprises a slider supporting portion; a head/slider having a bottom secured to said slider supporting portion, and including a head and a slider pad connected to said head; and a lead wire capable of being solder ball connection to said slider pad; wherein a plane including an extreme end portion of said lead wire and said slider pad cross each other at a crossing angle above 90 degrees on a surface on which said solder ball is arranged.

In the second aspect, the lead wire is inclined in a direction different from that of the first aspect with respect to the slider pad to thereby shorten the connection distance. The crossing angle may be any angle over 90 degrees, preferably, in the range of about 100 to 120 degrees.

According to a third aspect of the present invention, a head/slider supporting structure comprises a slider supporting portion; a head/slider having a bottom secured to said slider supporting portion, and including a head and a slider pad connected to said head; and a lead wire capable of being solder ball connection to said slider pad; wherein a plane including an extreme end portion of said lead wire crosses said slide pad at a right angle.

In the third aspect, the lead wire is directed at a right angle with respect to the slider pad. However, since the plane including the lead wire crosses the slider pad, the connection distance can be made shorter than the conventional connection structure. Any of the first to third modes can be applied to the rotating disk storage device such as the magnetic disk drive, and the magneto-optical disk drive. Further, the rotating direction of the rotating disk storage device may be not only the positive direction but also the reverse direction.

According to the present invention, it is possible to provide a head/slider supporting structure having connection performance excellent in a solder ball connection of a slider pad and a lead pad. Further, according to the present invention it is possible to provide a rotating disk storage device provided with the head/slider supporting structure excellent in connection performance.

DETAILED DESCRIPTION OF THE INVENTION

Figure 2:
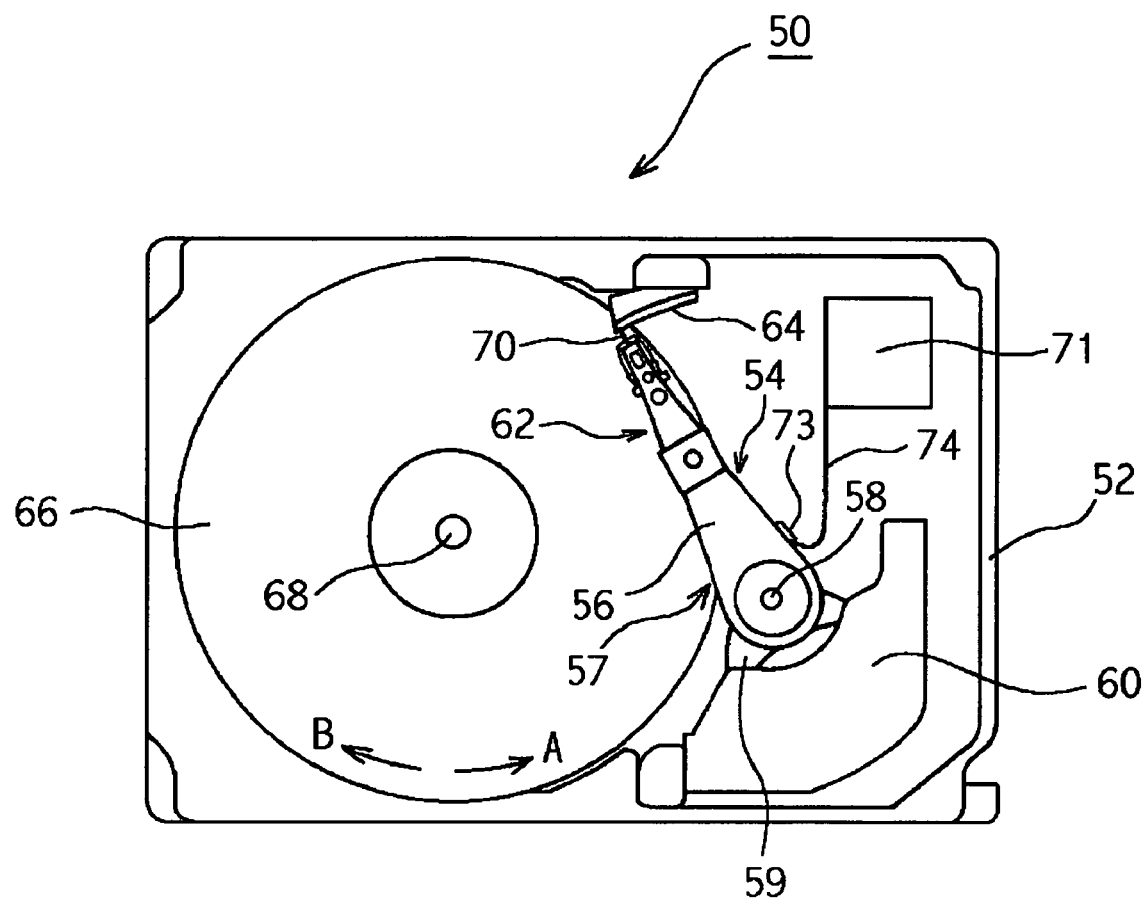
FIG. 2 is a plan view of a magnetic disk drive according to an embodiment of the present invention.

In the following, the embodiments of the present invention will be described with reference to the drawings. The same reference numerals denote the same structural elements throughout the drawings. FIG. 2 is a plan view showing the schematic structure of a magnetic disk drive 50 applied to the embodiments of the present invention. A base 52 forms a closed space together with a cover (not shown), and encases therein an actuator head suspension assembly 54, a magnetic disk 66, a ramp 64, and a semiconductor element 71 and the like.

The magnetic disk 66 is fixed to a spindle hub (not shown) so as to be rotated about a spindle shaft 68 by a spindle motor (not shown) provided below, and it has a magnetic layer formed at least on one surface thereof. Two magnetic disks 66 or more may also be stacked. With respect to the direction in which the magnetic disk 66 is rotated, the arrow A is called positive rotation and the arrow B is called reverse rotation in relation to the actuator head suspension assembly 54. The difference between the positive rotation and the reverse rotation mainly appears at a position of the head of the slider, but the present invention can be applied to the magnetic disk drives for both positive rotation and reverse rotation.

The actuator head suspension assembly 54 includes an actuator assembly 57 and a head suspension assembly 62 so that it may be pivoted about a pivot point 58. The actuator assembly 57 includes an actuator arm 56 mounting a head suspension assembly 62 thereon, a coil support 59 holding a voice coil (not shown), and a pivot housing corresponding to a communication portion between the actuator arm 56 and the coil support 59. A voice coil yoke 60 is provided on the base so as to constitute a voice coil motor along with the voice coil, and a voice coil magnet (not shown) or a permanent magnet is mounted on the back of the voice coil yoke 60.

The head suspension assembly 62 includes a load beam and a flexure (both of which are not shown) described in detail later. The so-called load/unload system is formed in which a merge lip 70 is formed at the extreme end of the load beam, and before the magnetic disk 66 stops its rotation, the merge lip 70 is slidably moved on the sheltering surface of the ramp 64 to retract the slider from the surface of the magnetic disk 66. However, the present invention is not limited to the application to the load/unload system, but can be also applied to the contact start stop system. The merge lip 70, the head suspension assembly 62 and the actuator arm 56 are formed as a lamination structure so as to accommodate the recording surface of the magnetic disk 66. A relay terminal 73 is provided on the actuator assembly 57 to connect a wiring trace (not shown) with one end connected to the head, and a flexible print circuit base plate 74 with one end connected to a semiconductor element 71.

Figure 3:
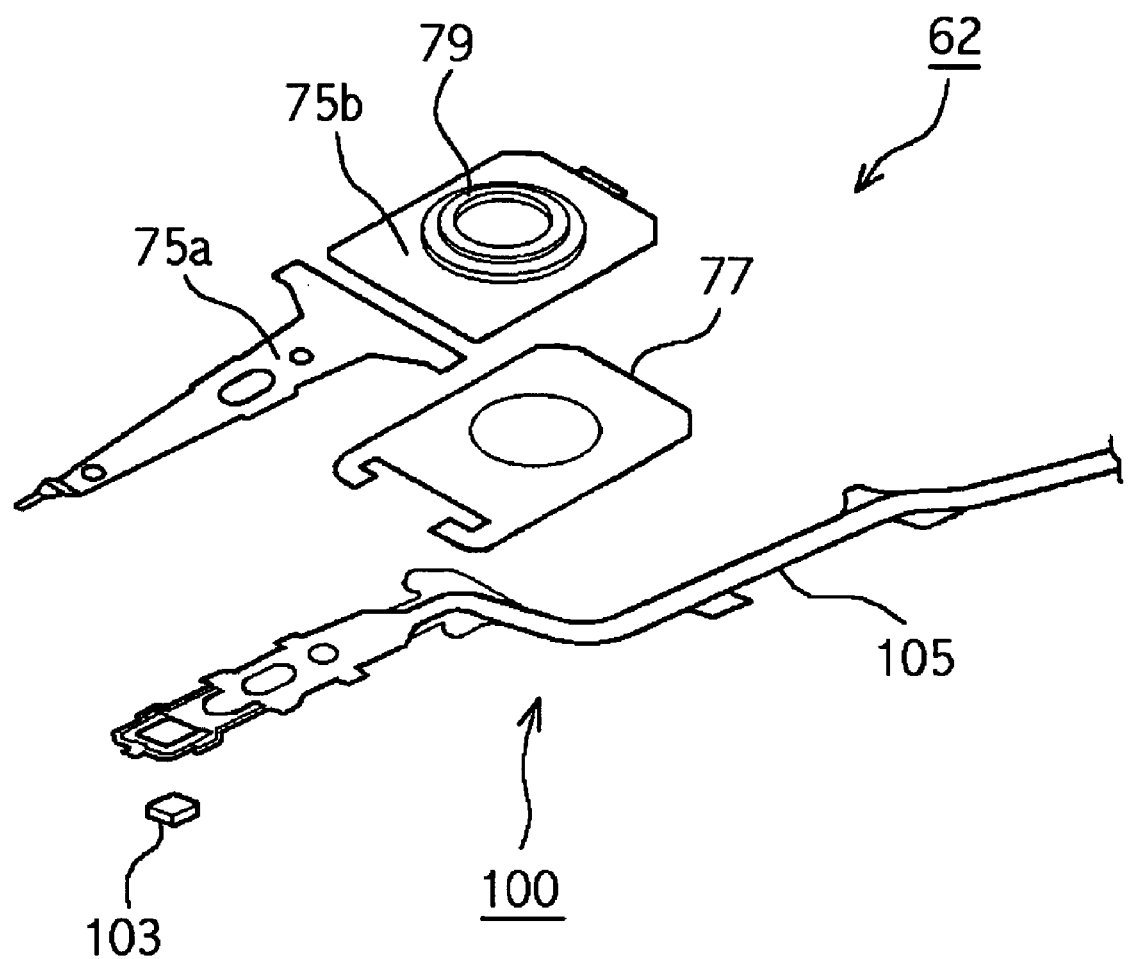
FIG. 3 is a view explaining the structure of a head suspension assembly according to an embodiment of the present invention.

FIG. 3 is a perspective view explaining the structure of the head suspension assembly 62 according to the embodiment of the present invention. The head suspension assembly 62 includes a mount plate 79, two pieces of load beams 75a, 75b, a hinge 77, and a flexure assembly 100. The flexure assembly 100 employs a wiring integral structure and has a wiring trace 105 as described later. In a flexure tang (not shown) of the flexure assembly 100, head/sliders 103 are mounted on both sides facing to the magnetic disk 66.

The flexure assembly 100 is fixed to the load beams 75a, 75b and the hinge 77 by spot welding or adhesives, and the mount plate 79 and the load beams 75a, 75b and the hinge 77 are also fixed integrally by spot welding or adhesives. The mount plate 79 is subjected to swath processing to fix the head suspension assembly 62 to the actuator arm 56. The load beams 75a, 75b rotate along with the actuator assembly 57 to carry the head/slider 103 to a fixed track and supply a pressing load for pressing the head/slider 103 on the surface of the magnetic disk 66. The head/slider 103 flies above while maintaining a certain distance from the surface of the magnetic disk 66 which rotates under the balance between the positive pressure which is a floating force received by an air bearing surface from an air flow and a pressing load caused by the load beam 75.

The wiring trace 105 has one end connected to the slider pad (not shown) and the other end connected to a relay terminal 73. The wiring integral flexure assembly generally has a metallic layer as a structure for supporting the head/slider and carrying out the gimbals movement, a conductor layer constituting a wiring trace, and a dielectric layer insulating the metallic layer and the conductor layer laminated, and provides a suitable cover layer on the conductor layer for preventing corrosion or applies plate treatment. The wiring integral flexure assembly provided with the lamination structure as described includes three types, that is, an additive type, a subtractive type, and a flexible base plate type depending on the difference of a manufacturing method.

The additive type is a method for stacking up layers in order using the photolithography technique. The subtractive type is a method for applying etching to a sheet formed in advance with a metallic layer, a dielectric layer, a conductor layer and a cover layer to form a fixed structure. The flexible base plate type is a method for pasting on the metallic layer the flexible print circuit base plate formed into a fixed shape by the dielectric layer, the conductor layer and the cover layer. The flexure assembly 100 according to the present embodiment is of the additive type, but the present invention can be applied to any type of wiring integral flexure assemblies. Further, the present invention is not limited to the wiring integral flexure assembly, but can be applied to all types of flexure assemblies in which the slider pad and the lead pad are connected by solder ball.

Figure 4:
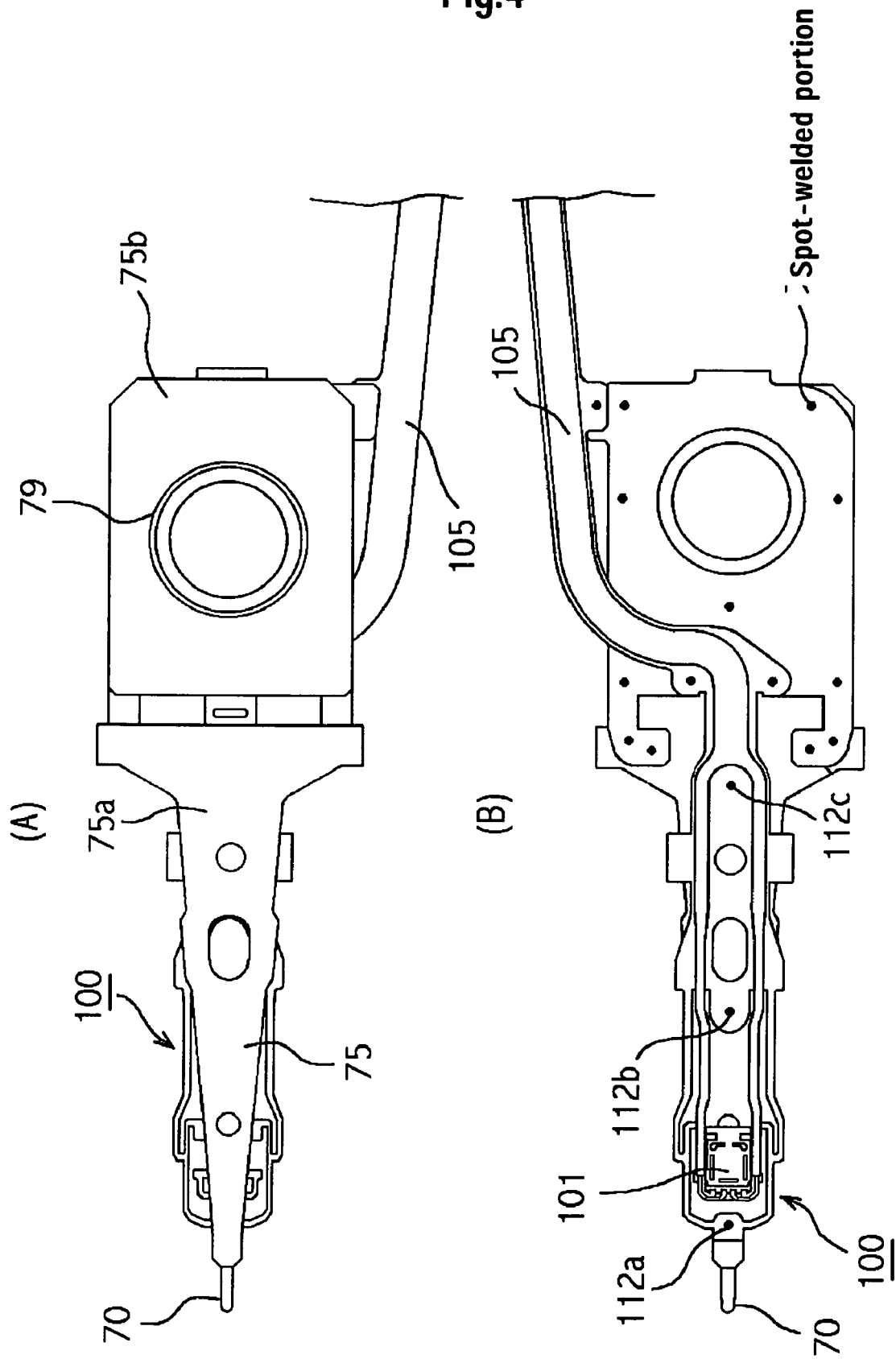
FIGS. 4(A) and 4(B) are views explaining the structure of a flexure assembly 100.
Figure 5:
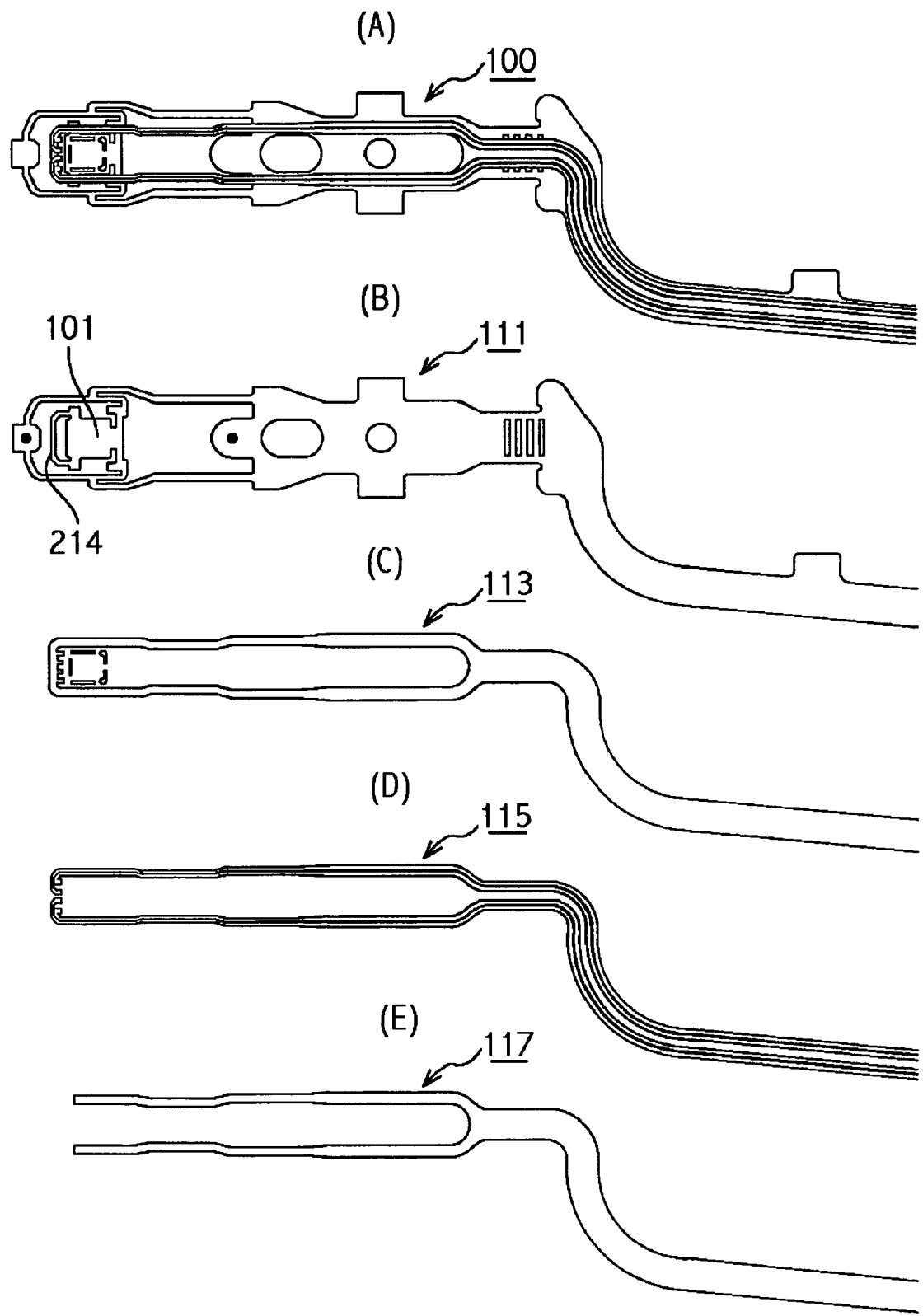
FIGS. 5(A) to 5(E) are views explaining the structure of a flexure assembly 100.

FIGS. 4 and 5 are views explaining the structure of the wiring integral flexure assembly 100. FIG. 4(A) is a plan view of the flexure assembly 100 shown in FIG. 3 enlarged from the top of the load beam, and FIG. 4(B) is a plan view from the bottom. FIG. 4(B) shows various welding spots illustrating positions of spot welding for assembling the flexure assembly. FIG. 4(B) shows a flexure tang 101 which is a place where the head/slider 103 is mounted. The flexure assembly 100 is fixed to the load beam 75a at three locations of welding spots 112a, 112b and 112c, and the flexure tang 101 is not fixed to the load beam 75a in order to enable the gimbals movement.

FIG. 5 is a view showing the lamination structure of the wiring integral flexure assembly 100 shown in FIG. 4. The flexure assembly 100 is formed using the semiconductor processing technique such as the photolithographic etching step, the evaporation step or the like as mentioned above. FIG. 5(A) shows the flexure assembly 100 completed by laminating a plurality of layers, and FIGS. 5(B) to 5(E) show the structure of layers constituting the flexure assembly 100. FIG. 5(A) is a view showing the completed flexure assembly 100 from the magnetic disk 66 side, the head/slider 103 being omitted for simplicity's sake. FIGS. 5(B) to 5(E) depict the order of lamination toward the surface of the magnetic disk.

FIG. 5(B) shows a plane of a metallic layer 111, and as a material, there is selected SUS304 having a thickness of 0.02 mm among stainless steel of 300 series. Further, the material of the metallic layer 111 is not limited to stainless steel, but other hard spring materials such as beryllium copper or titanium can be selected. The metallic layer 111 includes a flexure tang 101 and a platform 214.

FIG. 5(C) shows a plane of a dielectric layer 113 formed of polyimide for insulating the metallic layer 111 and a conductor layer 115 (see FIG. 7(D)). The dielectric layer 113 is laminated on the metallic layer 111 in the shape adjusted to a pattern of the conductor layer 115. In the present embodiment, the thickness of the dielectric layer selected is 0.01 mm. A part of the dielectric layer 113 is laminated also on the flexure tang 101.

FIG. 5(D) shows a conductor layer 115 which is a wiring pattern with respect to a head. In the present embodiment, pure copper is laminated so as to have a thickness of 0.01 mm into pattern. The material of the conductor layer is not limited to copper, but other material such as aluminum or silver may be employed. FIG. 5(E) shows a pattern of a cover layer 117 for protecting the surface of the conductor layer 115, and a polyimide layer having a thickness of about 0.003 mm is adhered to the conductor layer 115. The dielectric layer 113, the conductor layer 115 and the cover layer 117 are integrated to form a wiring trace 105. Thicknesses of the metallic layer 111, the dielectric layer 113, the conductor layer 115 and the cover layer 117 are indicated as an illustration, and the range of the present invention is not limited thereto.

Figure 6:
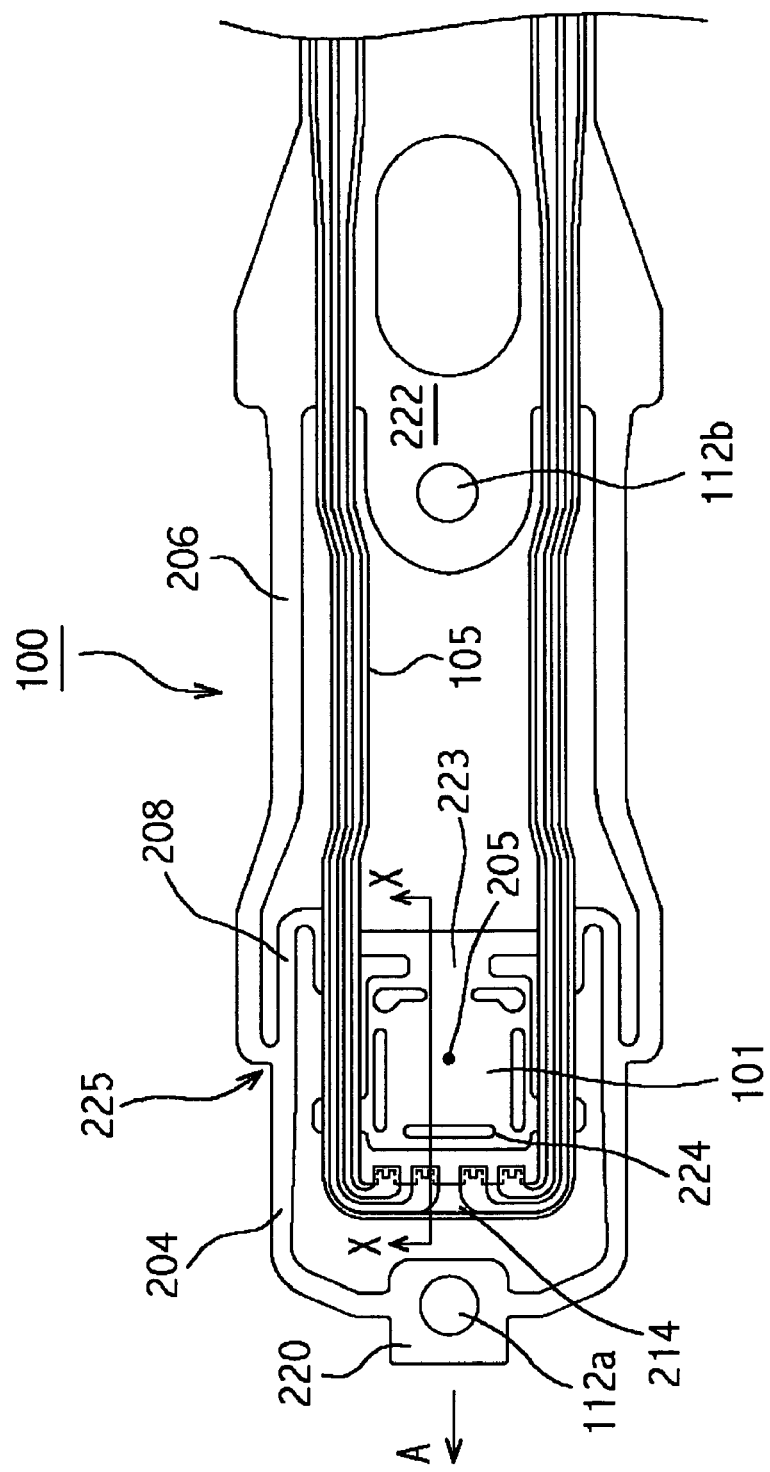
FIG. 6 is a view with the flexure assembly 100 shown in FIG. 5(A) enlarged.

FIG. 6 is a view in which the extreme end portion of the flexure assembly 100 shown in FIG. 5 is enlarged. In the present disclosure, the merge lip 70 side of the head suspension assembly 62 is referred to as the extreme end side, and the actuator arm 56 side is referred to as the support end side (see FIG. 2). The flexure tang 101 which is a part of the metallic layer 111 is formed between a welding spot 112a on the extreme end side of the flexure assembly 100 and a welding spot 112b on the support end side. In the flexure tang 101, there is defined a dimple contact point (hereinafter referred to as DCP) 205 on the center line joining the welding spots 112a and 112b and nearly in the central portion of the flexure tang 101. In the DCP 205, the flexure tang comes in contact, at the back (corresponding to the back of paper surface), with a dimple formed on the load beam 75a to constitute a support point of the gimbals movement. Further, the head slider 103 is mounted by means of adhesives to the surface side (corresponding to this side of paper surface) of the flexure tang 101.

A support region 220 on the extreme end side is a part of the metallic layer 111, which is spot-welded to the load beam 75a at the welding spot 112a. From the edge near the welding spot 112a, a pair of web-like main arms 204 extend to the support end side in symmetry with the center line joining the welding spots 112a and 112b. The main arms 204 extend to the support end side surrounding the periphery of the flexure tang 101, and become integrated with sub-arms 206 at a pair of positions 225 to form a pair of support arms 208, supporting a leading edge 223 of the flexure tang 101. All of the main arm 204, the sub-arm 206 and the support arm 208 are a part of the metallic layer 111.

The leading edge 223 termed herein is an end of the flexure tang on the side opposite to the side where the head is positioned when the head/slider 103 is mounted. An end on the side opposite to the leading edge of the flexure tang 101 is called a trailing edge. In the present disclosure, the terms of the leading edge and the trailing edge are to be used also with respect to the head slider 103 mounted on the flexure tang.

The flexure assembly 100 according to the present embodiment is applied to the magnetic disk drive of progressive rotation. In FIG. 2, the magnetic disk 66 rotates in the direction shown by arrow A from the support end side toward the extreme end side with respect to the flexure tang 101. A viscous air current generated in the surface of the magnetic disk flows so that it moves into a region between the air bearing surface and the disk surface from the leading edge side of the head/sliver 103 and flows out of the trailing edge to give the head/slider 103 a floating force.

A support region 222 which is a part of the metallic layer 111 is spot-welded to the load beam 75a at the welding spot 112b. A pair of sub-arms 206 extend symmetrically toward the extreme end side from the neighborhood of the welding spot 112b. A plurality of polyimide isle-like regions 224 which are a part of the dielectric layer 113 are adhered to the flexure tang 101. The isle-like regions 224 are provided to control an attitude of the slider when the head/slider 103 is adhered onto the flexure tang 101 by means of adhesives, and are laminated on the metallic layer 101 in the adhesion step of the dielectric layer 113 or the cover layer 117 shown in FIG. 5(C). Further, a pair of wiring traces 105 extend in parallel with the center line from the support region 222 on the support end side to the trailing edge side of the flexure tang 101. The wiring traces 105 are adhered to the metallic layer 111 in the support region 222, but extend to the support arm 208 near the flexure tang 101 without being adhered to other regions of the metallic layer 111 after having been separated from the support region 222.

In the pair of wiring traces 105, the conductor layer is divided into two and four lead wires in total are included. On the trailing edge side of the flexure tang 101, there is formed a platform 214 for locating the end of the lead wire to the slider pad when the lead wire is connected to the slider pad provided on the side of the trailing edge side of the head/slider 103. The platform 214 is a part of the metallic layer 111 is inclined in the direction mounting the slider 103 at 10 to 20 degrees with respect to the plane including the flexure tang 101 together with the dielectric layer 113 and the conductor layer 115.

Figure 7:
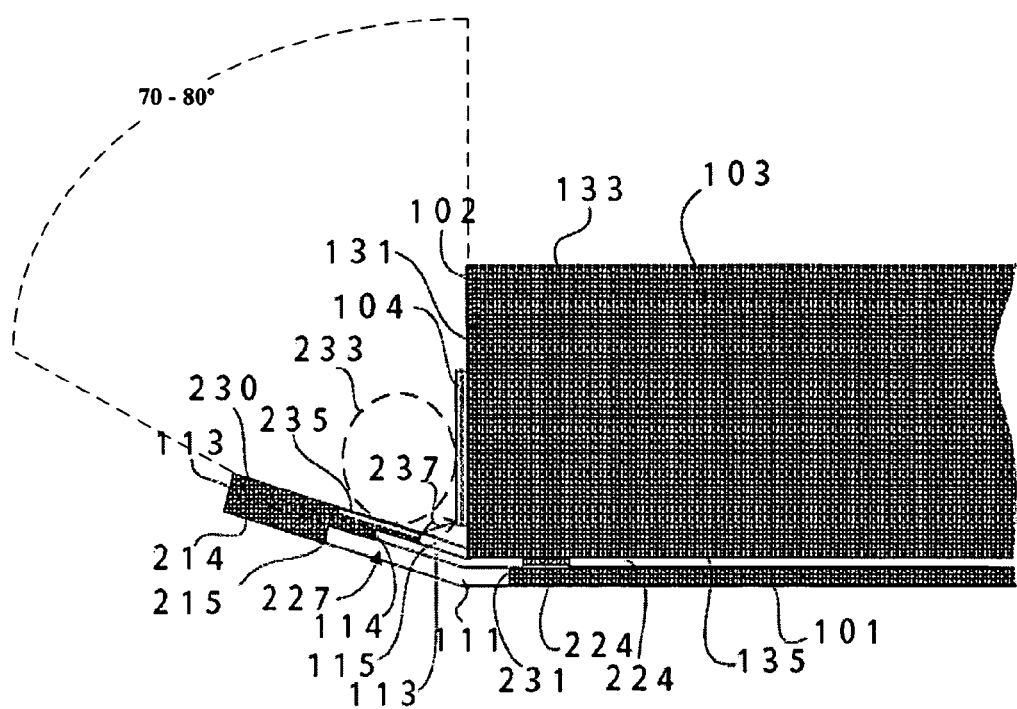
FIG. 7 is a side view for explaining an embodiment of a connection structure of a head/slider and a lead wire.

FIG. 7 is a side view for explaining the embodiment of the connection structure of the head/slider and the lead wire. A lead wire 230 is an element constituting the wiring trace 105 and is also a part of the conductor layer 115. The connection structure of FIG. 7 shows a part of X-X section in the state that the head/slider 103 is mounted on the flexure tang 101 of FIG.

6. The flexure tang 101 locks a bottom 135 of the slider 103 through a polyimide isle-like region 224. A head 102 is formed at a corner formed by a side 131 on the trailing edge side of the head/slider 103 and an air bearing surface 133. The head 102 is provided with a function of recording and reproducing or one of them.

The side 131 of the head/slider is provided with a slider pad 104 connected to the head 102. The slider pads 104 are formed in line with the side 131 of the slider adjusting to the number of lead wires 230. The slider pad 104 is formed closer to the air bearing surface 133 from the bottom 135 of the head/slider to prevent the slider pad 104 from short-circuiting with the body of the slider 103 due to the solder ball connection. The metallic layer 111 is bent on the slider pad 104 side in the vicinity of a position crossing the plane including the side 131 of the head/slider, and the platform 214 which is a part of the metallic layer 111, the dielectric layer 113 adhered thereon, and the lead wire 230 adhered on the dielectric layer 113 are integrally inclined. The bent position is not limited to that of the present embodiment, but it may be bent at any position as long as a connection distance 237 can be formed as will be described later. Further, the bent structure can be formed by press working. An opening 227 is provided between the platform 214 and the flexure tang 101 in order to secure a dimensional tolerance of a mutual positional relation between the head/slider 103 and the lead wire 230.

The dielectric layer 113 located under the lead wire 230 extends through the opening 227 so as to come closer to the slider pad 104 than the end 215 of the platform 214. The lead wire 230 extends through the opening 227 so as to come closer to the slider pad 104 than the end 114 of the dielectric layer 113. The dielectric layer 113 is extended from the end 215 of the platform to prevent short-circuiting between the lead wire 230 and the platform 214 because of the solder ball connection. Further, the lead wire 230 is extended from the end 114 of the dielectric layer 113 to prevent the dielectric layer 113 from burning when a laser beam for re-flowing the solder ball 233 is irradiated.

Figure 1:
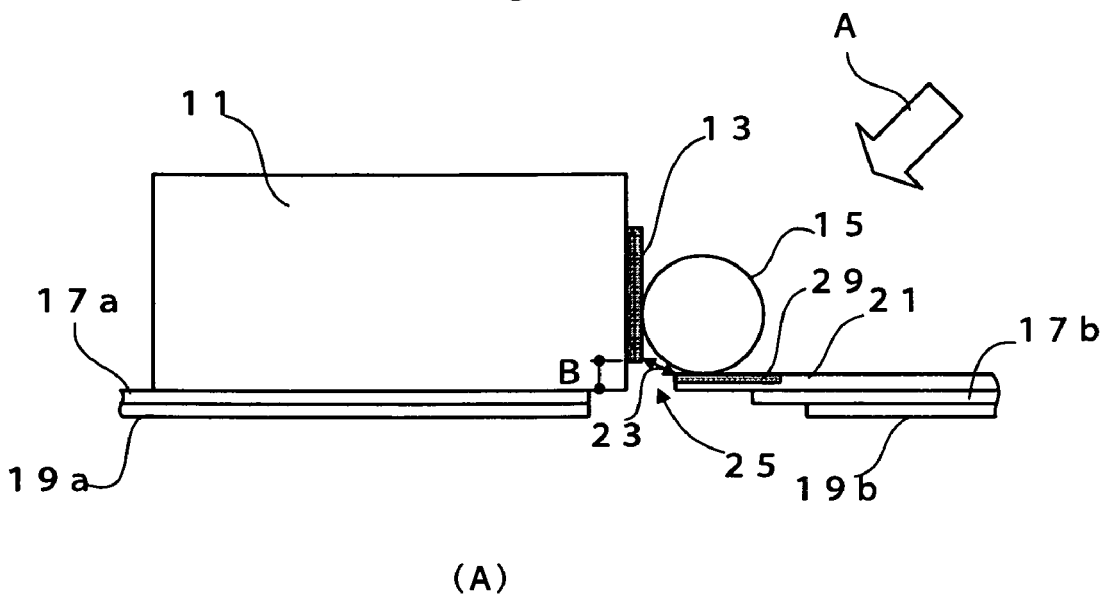
FIGS. 1(A) and 1(B) are views explaining the state when a lead pad and a head pad are connected by a solder ball.
Figure 1:
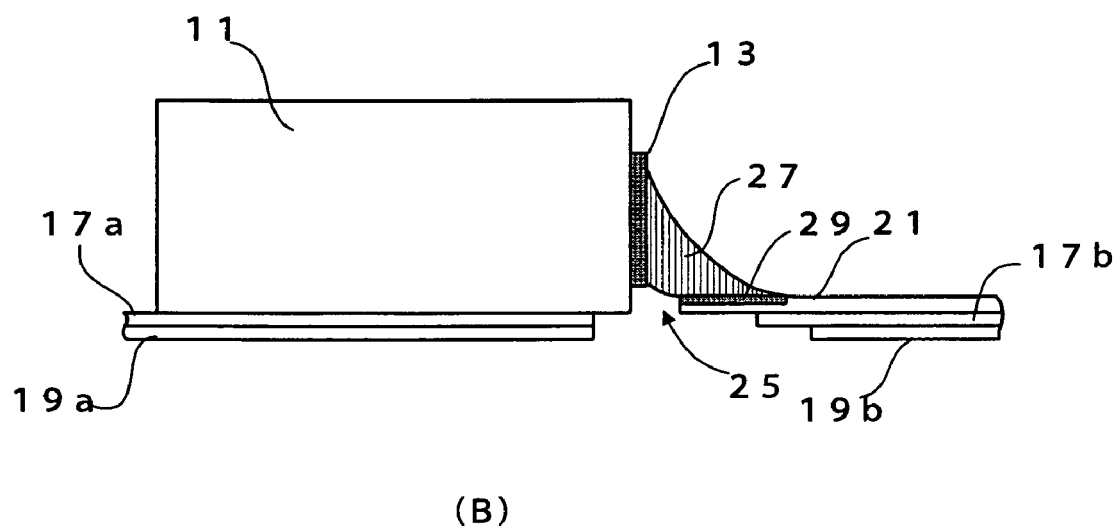

At the extreme end of the lead wire 230 is formed a lead pad 235 having a known solder ball holding structure as shown in Japanese Patent Laid-Open No. 2003-123217. The lead pad 235 means a position of the solder ball connection provided in the lead wire irrespective of the shape thereof. The head/slider 103 is fixed to the flexure tang 101 so that the side 131 is positioned close to the opening 227 from the trailing edge 231 of the flexure tang 101 to prevent the flexure tang 101 from short-circuiting with the slider pad 104 or the lead pad 235 at the time of re-flowing of the solder ball 233. The solder ball 233 is temporarily fixed between the lead pad 235 and the slider pad 104 to re-flow by a laser beam whereby both the pads can be connected. The flexure assembly 100 is constituted so that a crossing angle between the plane including the slider pad 104 and the plane including the lead wire 230 is less than 90 degrees, enabling shortening the connection distance 237 as compared with the connection distance 23 described in FIG. 1, and capable of enhancing the quality and yield of the solder ball connection. The crossing angle is preferably in the range of about 70 to 80 degrees, and the lower limit of the crossing angle is determined according to the size of the solder ball 233 to be used.

Figure 8:
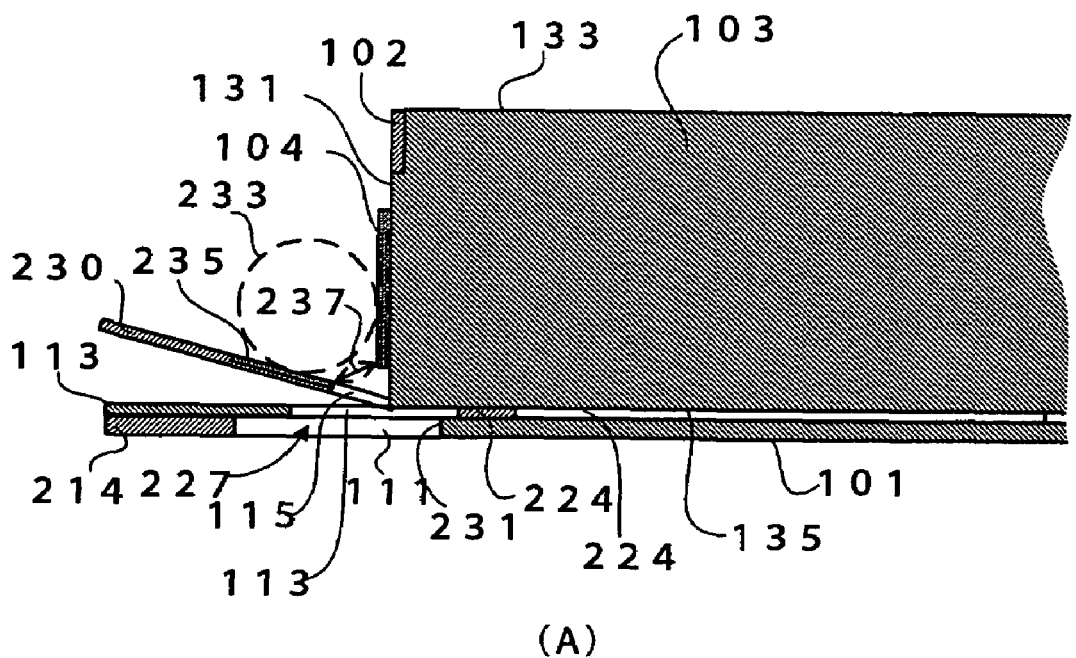
FIGS. 8(A) and 8(B) are side views for explaining another embodiment of a connection structure of a head/slider and a lead wire.
Figure 8:
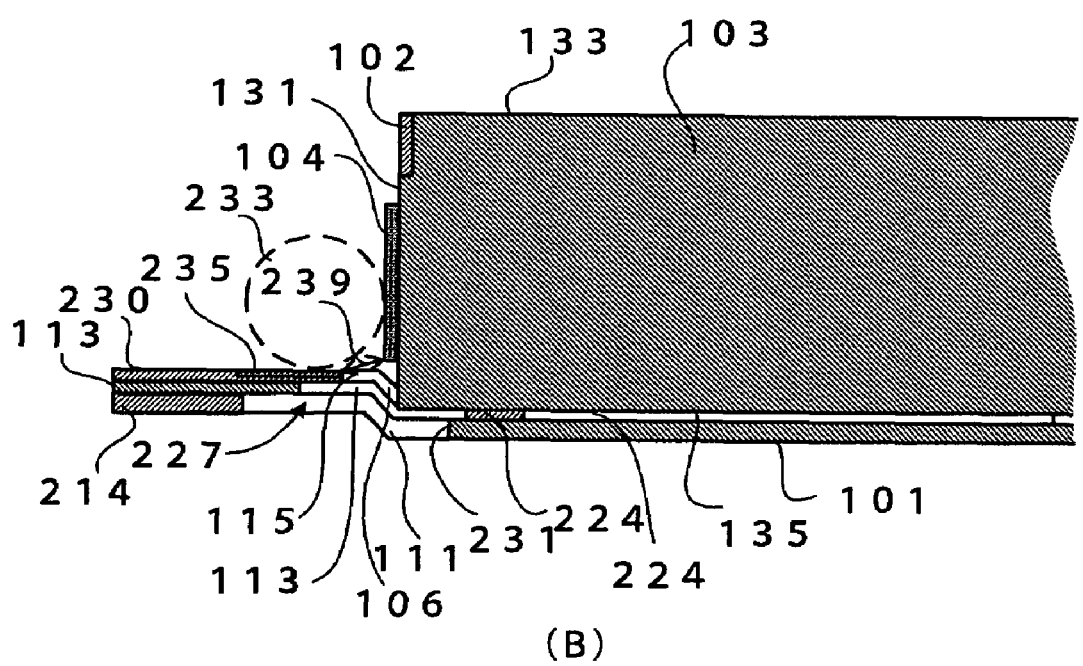

FIG. 8 is a side view for explaining a further embodiment of the connection structure of the head/slider and the lead wire. In the connection structure of FIG. 8(A), only a lead wire 230 is separated from a dielectric layer 131 in the vicinity of a position crossing the plane including a side 131 of the head/slider and bent on the slider pad 104 side to form a connection distance 237. Such a structure as described can be formed by press working in either an additive type wiring integral flexure assembly or a subtractive type wiring integral flexure assembly.

In the connection structure of FIG. 8(B), a metallic layer 111, a dielectric layer 113, and a conductor layer 115 are displaced upward in the figure in the vicinity of a position crossing the plane including the side 131 of the head/slider to form a connection distance 239. In this structure, the plane including the lead wire 230 crosses with the slider pad 104, and the connection distance 239 is shorter than the connection distance 23 shown in FIG. 1. The amount of displacement is set so that the plane including the lead wire 230 is to be the upper side from the lower side 106 of the slider pad 104. To provide the structure that the plane including the lead wire 230 is to be the upper side from the lower side 106 of the slider pad 104, the dielectric layer 113 may be laminated thickly on the metallic layer 111, or the conductor layer 115 may be laminated thereon.

Figure 9:
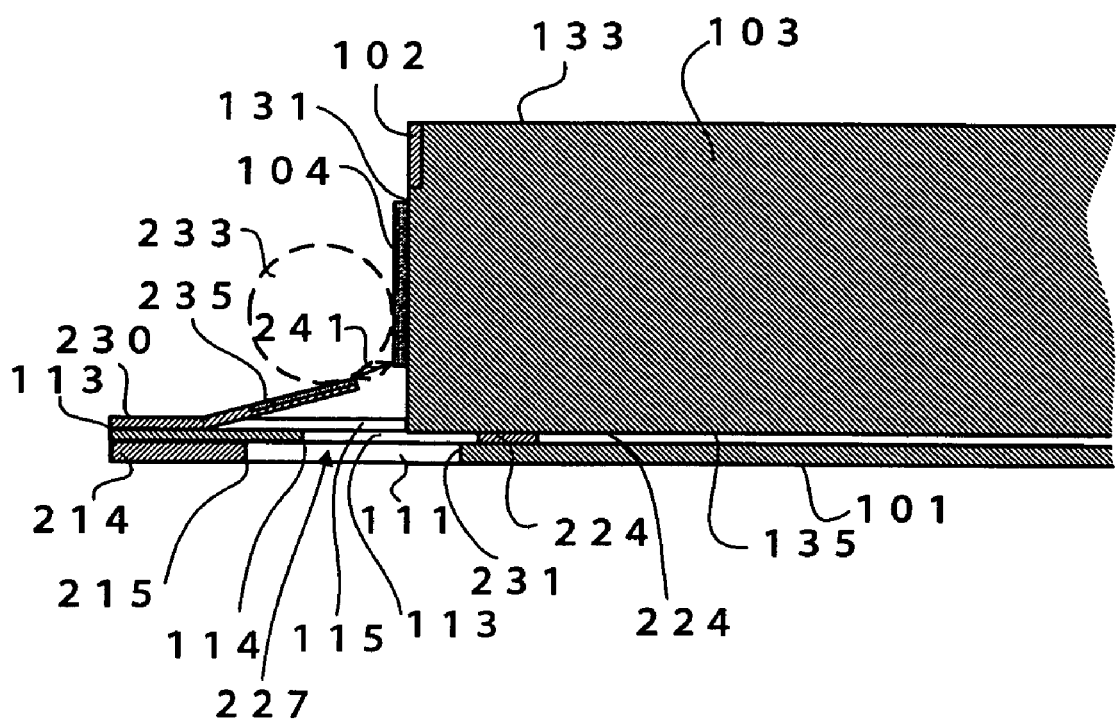
FIG. 9 is a side view for explaining another embodiment of a connection structure of a head/slider and a lead wire.

FIG. 9 is a side view for explaining another embodiment of the connection structure of the head/slider and the lead wire. In the connection structure of FIG. 9, the plane including the extreme end portion of a lead wire 230 and a slider pad 104 cross at a crossing angle over 90 degrees to form a connection distance 241. The connection distance 241 is shorter than the connection distance 23 shown in FIG. 1. In FIG. 9, the lead wire 230 is separated from a dielectric layer 113 and bent upward, but the lead wire 230 and the dielectric layer 113 may be integrally bent. The dielectric layer 113 extends toward the slider pad 104 side beyond an end 215 of a platform 214, and the lead wire 230 extends toward the slider pad 104 side beyond an end 114 of a dielectric layer. The crossing angle is varied according to a diameter of a solder ball, a connection distance, a head/slider structure, workability of fixing the solder ball, but in the present embodiment, the angle is set to the range of about 100 to 120 degrees.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims alone with their full scope of equivalents.

What is claimed is:

1. A rotating disk storage device comprising:
   a rotating disk recording medium;
   an actuator assembly; and
   a head/slider supporting structure coupled to said actuator assembly, said head/slider supporting structure comprising:
   a slider supporting portion;
   a head/slider having a bottom secured to said slider supporting portion, and including a head and a slider pad connected to said head; and
   a lead wire having an extreme end portion configured to be solder ball connected to said slider pad;
   wherein a plane including the extreme end portion of said lead wire and a plane including said slider pad cross each other at a crossing angle less than 90 degrees in the surface on which said solder ball is to be arranged, wherein said crossing angle is about 70 to 80 degrees.

2. A head/slider supporting structure comprising:
   a slider supporting portion;
   a head/slider having a bottom secured to said slider supporting portion, and including a head and a slider pad connected to said head; and
   a lead wire having an extreme end portion configured to be solder ball connected to said slider pad;
   wherein a plane including the extreme end portion of said lead wire and a plane including said slider pad cross each other at a crossing angle less than 90 degrees in the surface on which said solder ball is to be arranged, wherein said crossing angle is about 70 to 80 degrees.

3. A head/slider supporting structure comprising:

a slider supporting portion;

a head/slider having a bottom secured to said slider supporting portion, and including a head and a slider pad connected to said head; and a lead wire having an extreme end portion configured to be solder ball connected to said slider pad;

wherein a plane including the extreme end portion of said lead wire and a plane including said slider pad cross each other at a crossing angle less than 90 degrees in the surface on which said solder ball is to be arranged, wherein said head/slider supporting structure is a wiring integrated type flexure assembly including a laminated structure of a metallic layer, a conductor layer forming said lead wire, and a dielectric layer insulating said metallic layer from said conductor layer, and the extreme end portion of said lead wire is separated from said dielectric layer to form said crossing angle.

4. A rotating disk storage device comprising:

a rotating disk recording medium;

an actuator assembly; and a head/slider supporting structure coupled to said actuator assembly, said head/slider supporting structure comprising:

a slider supporting portion;

a head/slider having a bottom secured to said slider supporting portion, and including a head and a slider pad connected to said head; and a lead wire having an extreme end portion configured to be solder ball connected to said slider pad;

wherein a plane including the extreme end portion of said lead wire and a plane including said slider pad cross each other at a crossing angle less than 90 degrees in the surface on which said solder ball is to be arranged, wherein said head/slider supporting structure is a wiring integrated type flexure assembly including a laminated structure of a metallic layer, a conductor layer forming said lead wire, and a dielectric layer insulating said metallic layer from said conductor layer, and the extreme end portion of said lead wire is separated from said dielectric layer to form said crossing angle.

5. The rotating disk storage device according to claim 4, wherein said slider pad is formed on a side surface on a support end side of said slider.

* * * * *